United States Patent
Hato et al.

(10) Patent No.: US 7,300,909 B2
(45) Date of Patent: Nov. 27, 2007

(54) SUPERCONDUCTING CIRCUIT

(75) Inventors: Tsunehiro Hato, Kawasaki (JP);
Masahiro Horibe, Tsukuba (JP);
Keiichi Tanabe, Mito (JP)

(73) Assignee: Fujitsu Limited, Kawasaki (JP)

( * ) Notice: Subject to any disclaimer, the term of this patent is extended or adjusted under 35 U.S.C. 154(b) by 17 days.

(21) Appl. No.: 10/809,919

(22) Filed: Mar. 26, 2004

(65) Prior Publication Data

US 2005/0029512 A1 Feb. 10, 2005

(30) Foreign Application Priority Data

Mar. 28, 2003 (JP) .............................. 2003-092545

(51) Int. Cl.
*H01B 1/00* (2006.01)
(52) U.S. Cl. ...................... 505/234; 505/100
(58) Field of Classification Search ................ 505/234, 505/100
See application file for complete search history.

(56) References Cited

U.S. PATENT DOCUMENTS

2004/0077504 A1* 4/2004 Adachi et al. .............. 505/234

FOREIGN PATENT DOCUMENTS

JP       2000-353831       12/2000

* cited by examiner

*Primary Examiner*—Long Pham
(74) *Attorney, Agent, or Firm*—Kratz, Quintos & Hanson, LLP (57) ABSTRACT

A first Josephson junction in a Single Flux Quantum circuit (SFQ circuit) and a second Josephson junction in an interface circuit (latch driver circuit) are formed with junction materials different from each other, and the junction materials are selected so that the hysteresis of the first Josephson junction in a current-voltage characteristic is smaller than the hysteresis of the second Josephson junction in a current-voltage characteristic.

10 Claims, 8 Drawing Sheets

<JUNCTION FOR SFQ CIRCUIT>

FIG. 4A

<JUNCTION FOR LATCH DRIVER CIRCUIT>

FIG. 4B

<JUNCTION FOR SFQ CIRCUIT>

FIG. 5A

<JUNCTION FOR LATCH DRIVER CIRCUIT>

<JUNCTION FOR SFQ CIRCUIT>

FIG. 7

<JUNCTION FOR SFQ CIRCUIT>

FIG. 8

SUPERCONDUCTING CIRCUIT

CROSS-REFERENCE TO RELATED APPLICATIONS

This application is based upon and claims the benefit of priority from the prior Japanese Patent Application No. 2003-092545, filed on Mar. 28, 2003, the entire contents of which are incorporated herein by reference.

BACKGROUND OF THE INVENTION

1. Field of the Invention

The present invention relates to a superconducting circuit provided with a Single Flux Quantum (SFQ) circuit using a high temperature superconductor and an interface circuit for the single flux quantum circuit, and is applicable to fields of communication, computing, and instrumentation such as routers for communication, servers, AD converters, samplers, and so on.

2. Description of the Related Art

Conventionally, high temperature superconductor junctions have been thought to be applicable to the SFQ circuits as they are without being shunted by resistance because their current-voltage characteristics are called an overdamp type, and unlike low temperature movement Nb superconductor junctions, the hysteresis in the current-voltage characteristic is sufficiently small. The latch driver circuits which are important as an interface circuit are thought to be unsuitable for the formation of a high temperature superconductor because pulse logic in the SFQ circuit is converted into level logic so as to be usable with an external semiconductor device or the like, which requires hysteresis in the current-voltage characteristic.

Conventionally, in superconducting circuits in which the SFQ circuits using high temperature superconductors and the interface circuits are installed together, the design has to be made to conform to a slight operational region in which the SFQ circuit and the interface circuit can coexist, such as critical current density.

[Patent Document 1]
Japanese Patent Application Laid-open No. 2000-353831

SUMMARY OF THE INVENTION

However, since in the above-described superconducting circuit, for both of the SFQ circuit and the interface circuit, operation has to be carried out in a slight operational region in which the SFQ circuit and the interface circuit can coexist respectively, there has been a disadvantage that respective maximum performances, for instance, rapidness cannot be displayed. For instance, in order to improve the performance of the interface circuit, when the critical current density is set larger than the operational region, junction of the SFQ circuit also exhibits hysteresis, which makes operation of the SFQ circuit impossible. On the other hand, in order to improve the performance of the SFQ circuit, when the critical current density is set smaller than the operational region, the junction of the interface circuit loses hysteresis necessary for its own operation, which makes operation of the interface circuit impossible.

The present invention has been carried out in consideration of the above-described disadvantage, and the present invention is to provide a superconducting circuit which widen an operational region where a single flux quantum circuit and an interface circuit can operate coexistingly in an operation of the super conducting circuit provided with the single flux quantum circuit using the high temperature superconductor and an interface circuit, so that respective circuits can exhibit operations in high performance.

As a result of earnest studies the present inventors have come up with various forms of the inventions described below.

The superconducting circuit of the present invention is provided with a single flux quantum circuit using a high temperature superconductor and an interface circuit for the single flux quantum circuit, in which the single flux quantum circuit described above has a first Josephson junction and the interface circuit described above has a second Josephson junction composed of a combination of materials different from those of the first Josephson junction, and hysteresis of the first Josephson junction in current-voltage characteristic is smaller than the hysteresis of the second Josephson junction in current-voltage characteristic.

DETAILED DESCRIPTION OF THE PREFERRED EMBODIMENTS

Gist of Present Invention

In order to solve a problem that operations of an SFQ circuit and an interface circuit are limited in a slight operational region where both can coexist with each other so that respective circuits cannot perform operations in high performance, the present inventors have come up with a gist of the invention described below.

In the present invention, in an SFQ circuit and an interface circuit using a high temperature conductor, a Josephson junction of the SFQ circuit and a Josephson junction of the interface circuit are formed from materials different from each other. The reason of forming the circuits in this way is because by selecting the composing materials used in the Josephson junction separately for respective circuits, the hysteresis of the Josephson junction in current-voltage characteristic is to set according to purpose of usage. Thus, by selecting a junction material having small hysteresis for the SFQ circuit, and a junction material having large hysteresis for the interface circuit, it becomes possible for respective circuits to perform operations in high performance.

Further, the reason of setting the hysteresis of the SFQ circuit in the current-voltage characteristic to be 10% or less is because usually biasing is performed in an operation of the SFQ circuit, and in the case of T-FF, if the hysteresis exceeds 10%, bias margin for the bias comes to less than 30%, which hinders an operation of the SFQ circuit. On the other hand, the reason of setting the hysteresis of the interface circuit in current-voltage characteristic to be 10% or more is because if the hysteresis is less than 10%, it becomes insufficient as a hysteresis to convert a pulse logic in the SFQ circuit into a level logic used in an external semiconductor device or the like.

Figure 1:
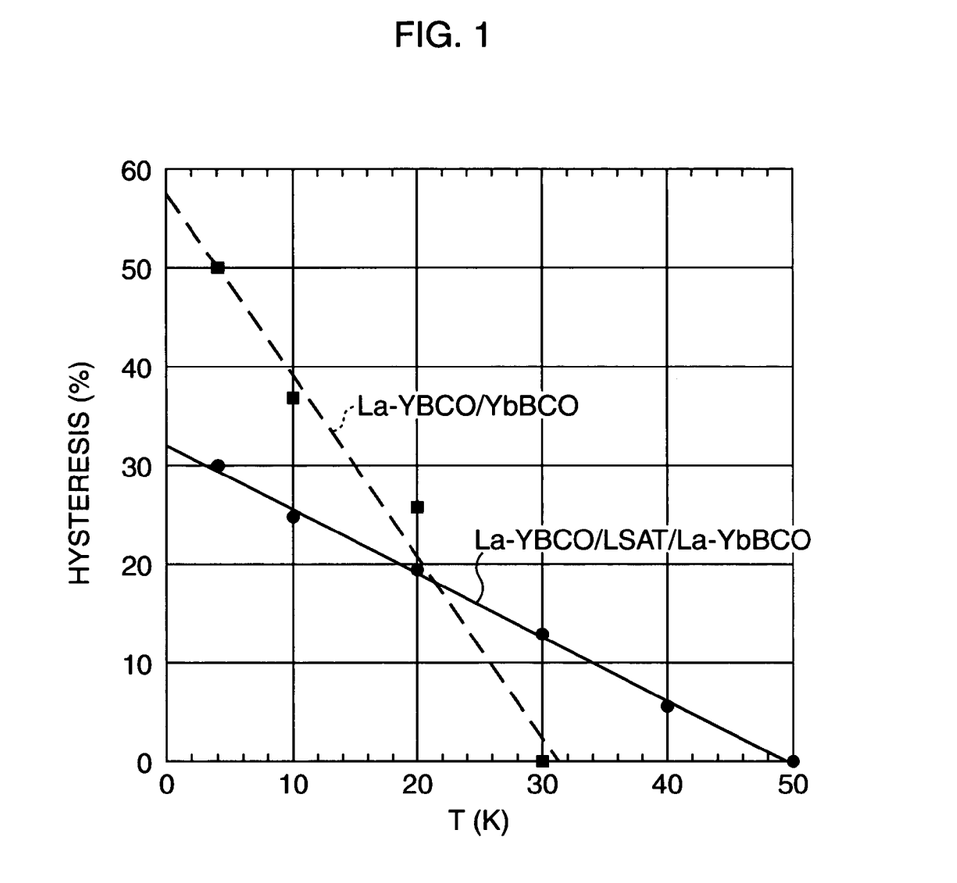
FIG. 1 is a thermal characteristic diagram showing an example of hysteresis in current-voltage characteristic of superconducting junctions made from a combination of materials different from each other.

FIG. 1 is a thermal characteristic diagram showing an example of hysteresis in current-voltage characteristic of superconducting junctions made from a combination of materials different from each other.

As shown in the drawing, hysteresis disappears at a temperature of 30K with a junction prepared in a manner that a lower electrode is La-doped YBaCuO, a barrier is a damage layer in which its crystal state is varied by ion milling, and an upper electrode is YbBaCuO. On the other hand, with a junction prepared in a manner that the lower electrode is La-doped YBaCuO, the barrier is LaSrAlTaO in addition to the damage layer by ion milling, and the upper electrode is La-doped YbBaCuO, it still shows hysteresis even at 30K, and the hysteresis is found not to disappear until the temperature comes to 50K. When the former is used for an SFQ circuit, and the latter is used for an interface circuit, respective circuits can exhibit their performance sufficiently. The reason of showing such a characteristic is due to a characteristic of the junction barrier.

Besides, the present inventors have found that even when a critical current is varied, the temperature at which hysteresis disappears remains substantially constant. Therefore, for instance, a junction in which hysteresis disappears at a temperature of 30K is found to be unusable as an interface circuit at a temperature of 30K, even if when a large critical current is set.

Figure 2:
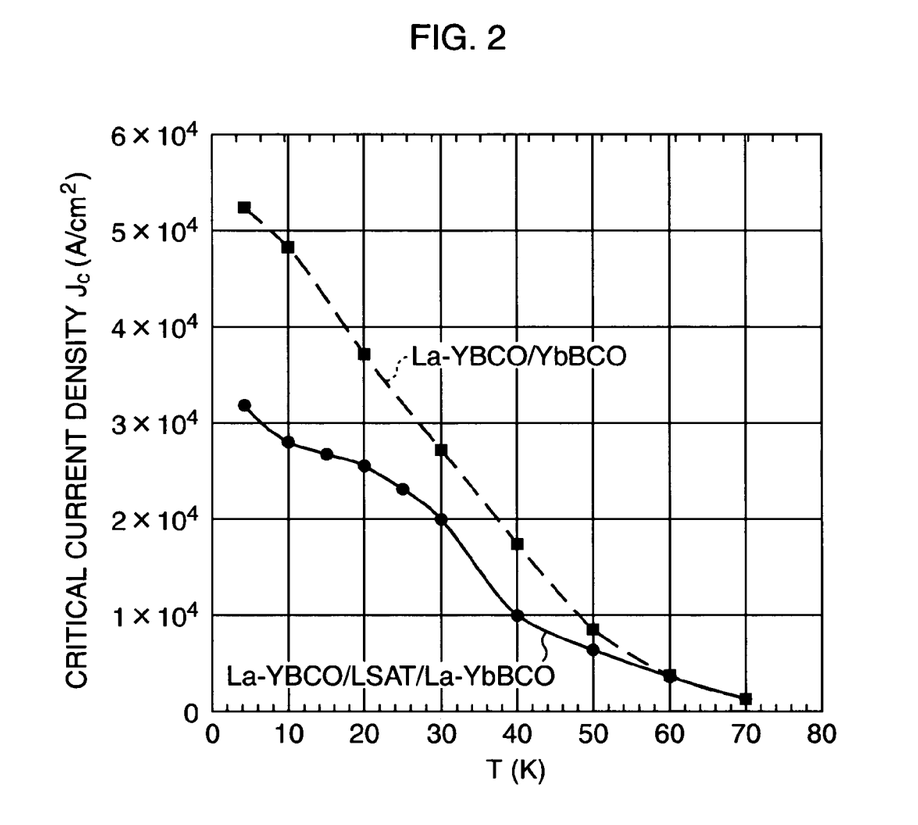
FIG. 2 is a thermal characteristic diagram of the critical current densities in respective junctions shown in FIG. 1.

FIG. 2 is a thermal characteristic diagram of critical current densities in respective junctions shown in FIG. 1. The former shows a decrease in the critical current density almost linearly as the temperature rises, while the latter shows a change with a shape protruding upward. This indicates that the former is a Josephson junction showing a self-shunt type nature and the latter is a Josephson Junction showing a tunnel type nature.

Figure 3:
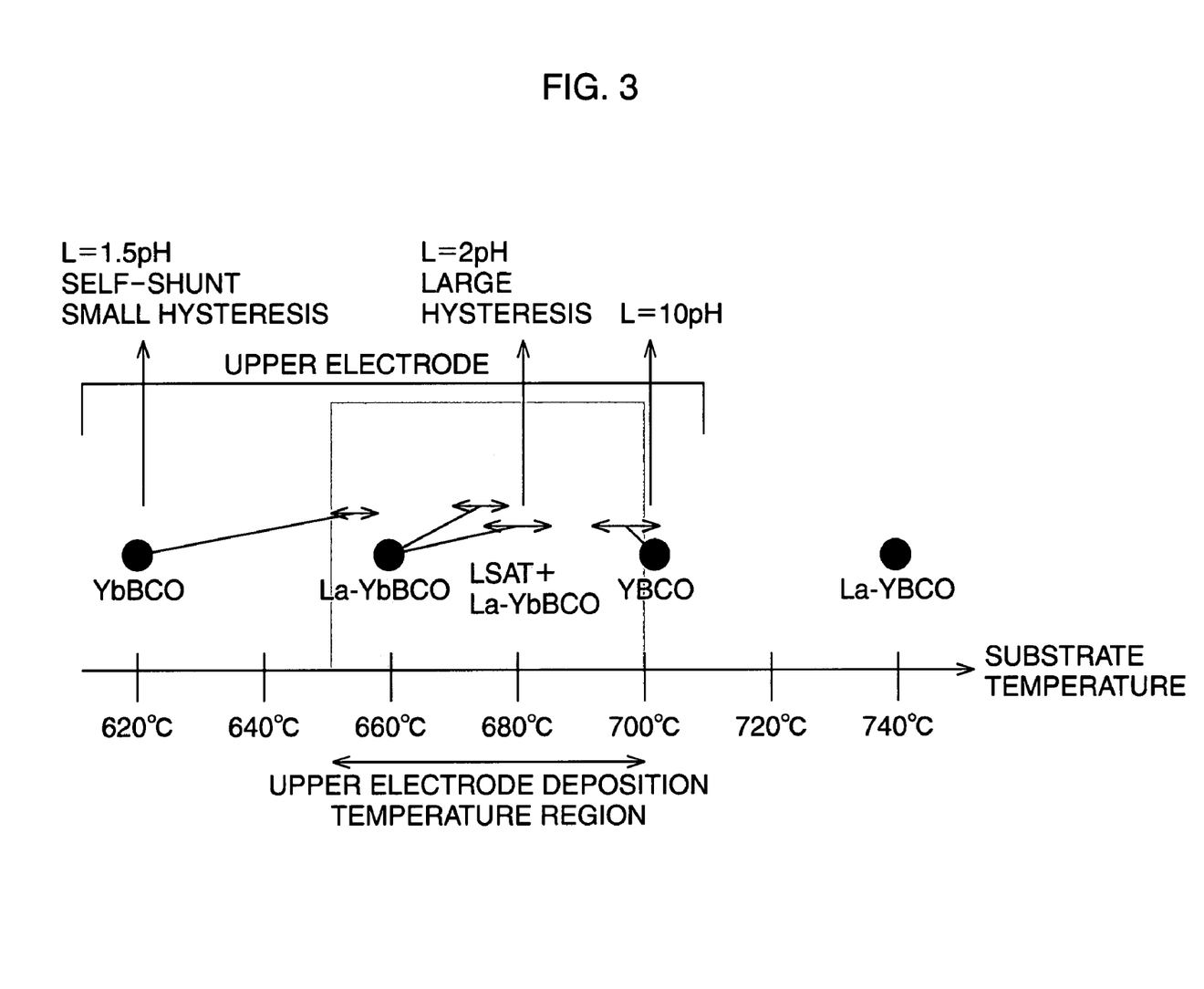
FIG. 3 is a diagrammatic view showing temperatures necessary for crystallization and deposition temperatures in respective materials during formation of an upper electrode.

FIG. 3 is a diagrammatic view showing temperatures necessary for crystallization and deposition temperatures in respective materials during formation of an upper electrode. Here, the temperatures necessary for crystallization are shown by black circles, and the deposition temperatures at the time of forming junctions are shown by arrows. The gray zone is a deposition temperature range of the upper electrode necessary to obtain a preferable junction characteristic. Furthermore, tendencies of the junction characteristic for respective materials when used as upper electrode materials are listed.

It is preferable to select, as materials forming the lower electrode, ones having sufficiently high crystallization temperatures so that the characteristic is not changed at the time of forming a junction, namely at the time of upper electrode deposition. On the other hand, materials forming the upper electrode are required to be crystallized sufficiently at the junction forming temperature. Therefore, it is preferable to select ones having crystallization temperatures lower than the junction forming temperature. Therefore, it is undesirable to form the upper electrode with YBaCuO.

Among respective materials, when YbBaCuO is used for the upper electrode, it crystallizes sufficiently, but hysteresis disappears at a temperature of 30K. Accordingly, it is unsuitable to apply this material to the interface circuit. When La-doped YbBaCuO is deposited after deposition of amorphous LaSrAlTaO (LSAT), it becomes possible to raise the junction forming temperature compared with the case of depositing La-doped YbBaCuO alone, so that sufficiently crystallized La-doped YbBaCuO can be formed. As a result, a junction having a junction characteristic of large hysteresis without self-shunt, and with small inductance at a climbing over portion, without causing steps in the hysteresis.

Concrete Embodiment Adopting Gist of Present Invention

Next, various embodiments based on the gist of the superconducting circuit of the present invention will be described. Further, an example of adopting a latch driver circuit as an interface circuit of the superconducting circuit in an embodiment of the present invention will be explained.

First Embodiment

Figure 4A:
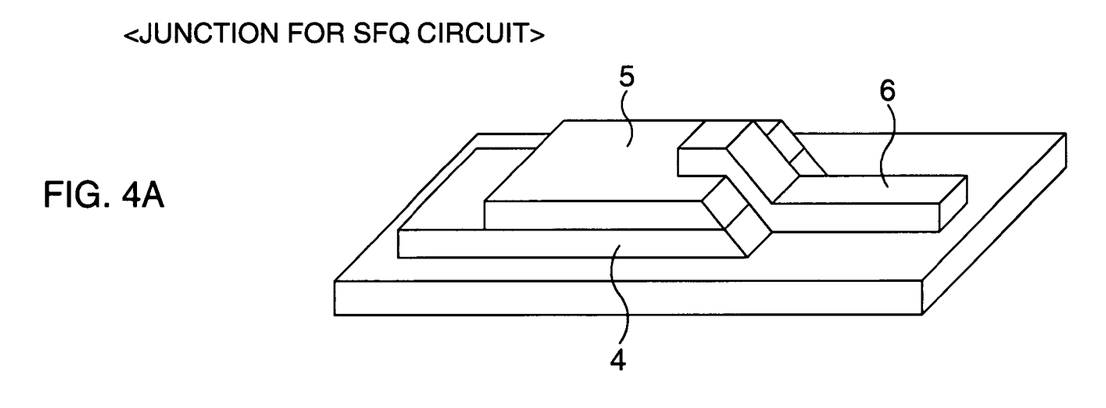
FIG. 4A is a perspective view showing configurations of junction parts of an SFQ circuit.
Figure 4B:
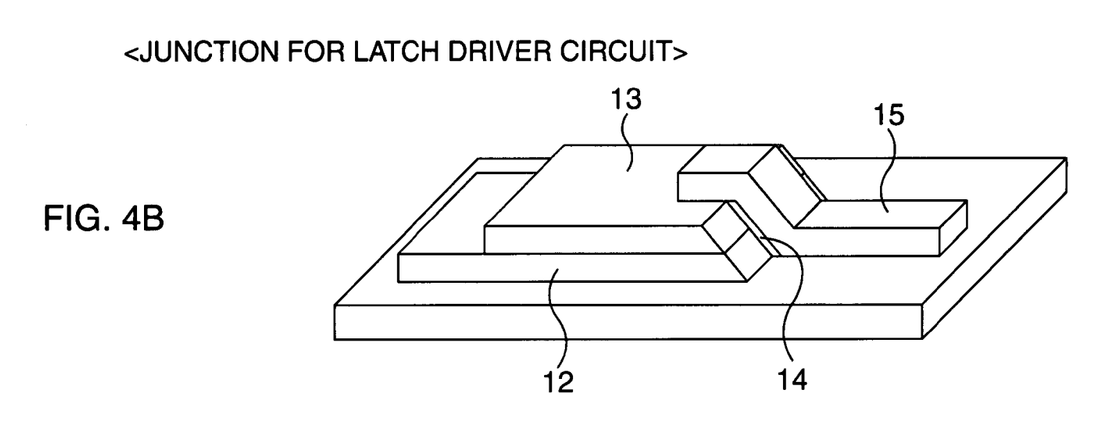
FIG. 4B is a perspective view showing a latch driver circuit in a superconducting circuit in a first embodiment.

FIGS. 4A and 4B are perspective views showing configurations of junction parts of an SFQ circuit and a latch driver circuit in a superconducting circuit in a first embodiment.

A junction part of the SFQ circuit shown in FIG. 4A is formed of a lower electrode 4 made from lantern (La)-doped YBaCuO of about 200 nm in thickness, an insulating layer 5 made from SrSnO of about 300 nm in thickness on the lower electrode 4, and an upper electrode 6 made from YbBaCuO of about 200 nm in thickness on ramp edges of the insulating layer 5 and the lower electrode 4. At the ramp edges of the insulating layer 5 and the lower electrode 4, a damage layers (not shown) to be served as a barrier is formed by ion milling with Ar or the like.

On the other hand, the junction part of the latch driver circuit shown in FIG. 4B is formed of a lower electrode 12 made from La-doped YBaCuO of about 200 nm in thickness, an insulating layer 13 made from SrSnO of about 300 nm in thickness on the lower electrode 12, an amorphous LaSrAlTaO layer 14 of about 5 nm in thickness on ramp edges of the insulating layer 13 and the lower electrode 12, and an upper electrode 15 made from La-doped YbBaCuO of about 200 nm in thickness on the amorphous LaSrAlTaO layer 14 and the insulating layer 13. At the ramp edges of the insulating layer 13 and the lower electrode 12, a damage layer (not shown) is formed by ion milling with Ar or the like, and a barrier is formed by the damage layer together with the amorphous LaSrAlTaO layer 14 formed on the damage layer.

The latch driver circuit in the superconducting circuit of this embodiment forms a capacitive junction to realize a Josephson junction with a large hysteresis by providing the barrier with the amorphous LaSrAlTaO layer 14 with enhanced insulation ability in addition to the damage layer by ion milling.

Second Embodiment

Figure 5A:
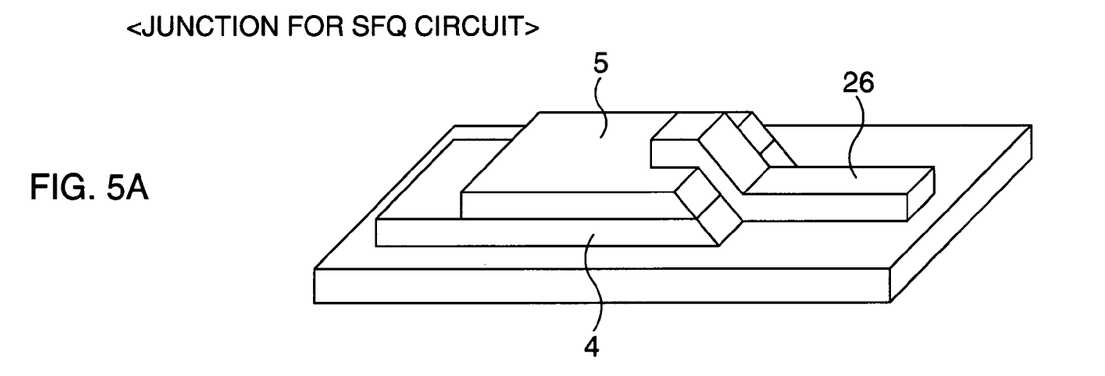
FIG. 5A is a perspective view showing configurations of junction parts of an SFQ circuit.
Figure 5B:
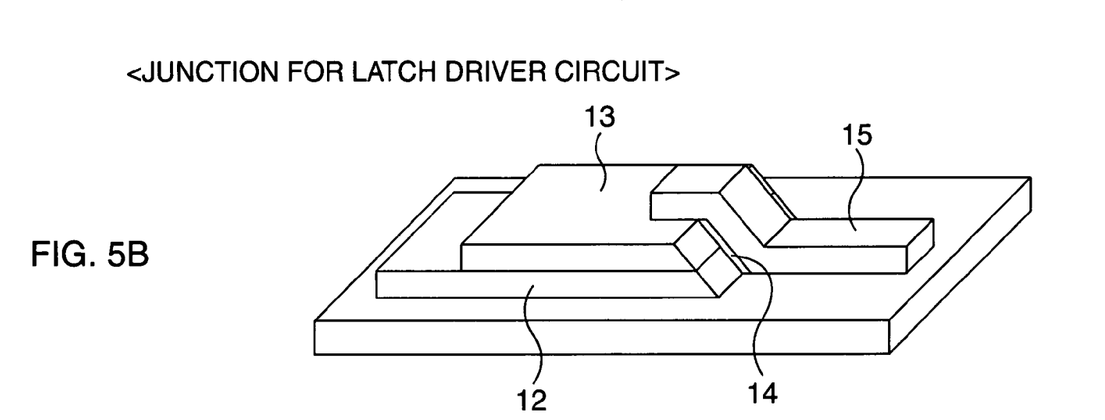
FIG. 5B is perspective view showing a latch driver circuit in a superconducting circuit in a second embodiment.

FIG. 5A and FIG. 5B are perspective views showing configurations of junction parts of an SFQ circuit and a latch driver circuit in a superconducting circuit in the second embodiment.

The junction part of the SFQ circuit shown in FIG. 5A is formed of a lower electrode 4 made from La-doped YBaCuO of about 200 nm in thickness, an insulating layer 5 made from SrSnO of about 300 nm in thickness on the lower electrode 4, and an upper electrode 26 made from La-doped YbBaCuO of about 200 nm in thickness on ramp edges of the insulating layer 5 and the lower electrode 4. At the ramp edges of the insulating layer 5 and the lower electrode 4, a damage layer (not shown) serving as a barrier is formed by ion milling with Ar or the like.

On the other hand, the junction part of the latch driver circuit shown in FIG. 5B is, similarly to the junction part of the latch driver circuit in the first embodiment, formed of a lower electrode 12 made from La-doped YbBaCuO of about 200 nm in thickness, an insulating layer 13 made from SrSnO of about 300 nm in thickness on the lower electrode 12, an amorphous LaSrAlTaO layer 14 of about 5 nm in thickness on ramp edges of the insulating layer 13 and the lower electrode 12, and an upper electrode 15 made from La-doped YbBaCuO of about 200 nm in thickness on the amorphous LaSrAlTaO layer 14. At the ramp edges of the insulating layer 5 and the lower electrode 4, a damage layer (not shown) is formed by ion milling with Ar or the like, and a barrier is formed by the damage layer together with the amorphous LaSrAlTaO layer 14 formed on the damage layer.

When compared with the superconducting circuit of the first embodiment, since the superconducting circuit of the present embodiment uses La-doped YbBaCuO forming the upper electrode in the SFQ circuit, the forming temperature of the upper electrode may be made higher. Thereby, it becomes possible to improve freedom of formation of a superconducting circuit such as formation of a wiring layer made from YbBaCuO which is capable of lower temperature growth on the upper electrode or formation of a ground plane shown in FIG. 7 which will be described later.

Third Embodiment

Figure 6:
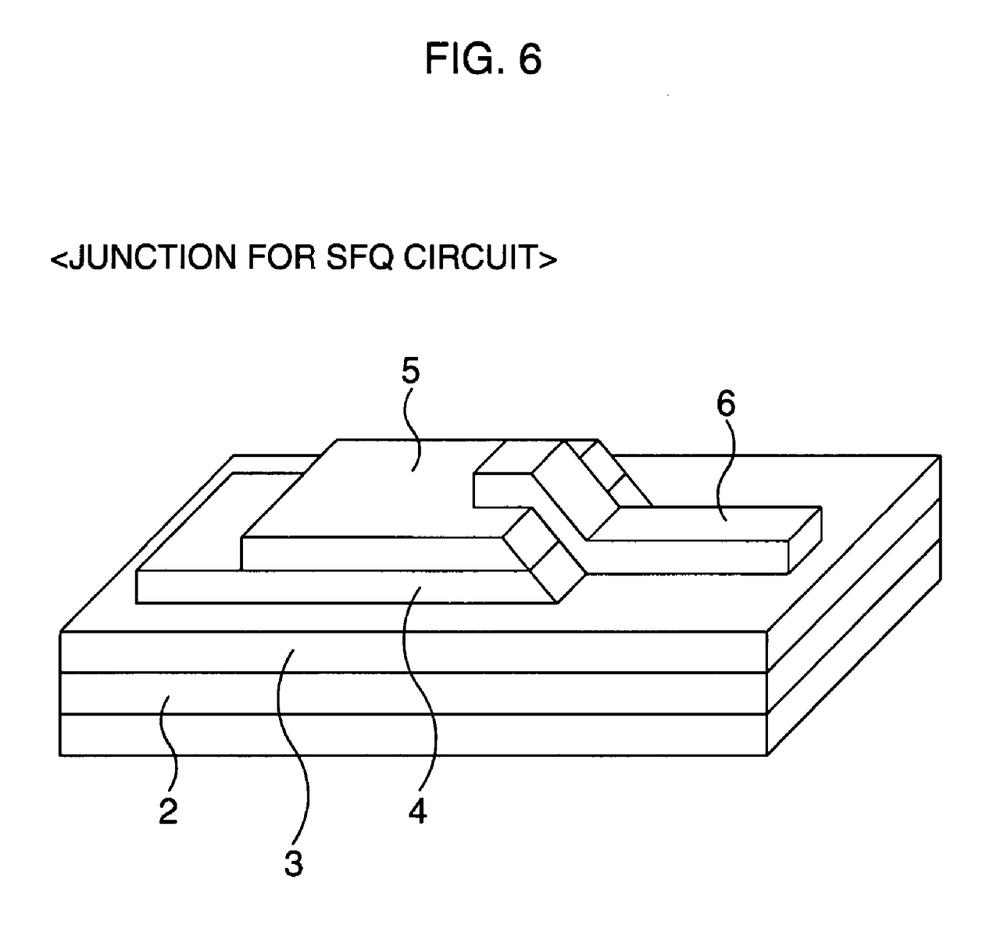
FIG. 6 is a perspective view showing a configuration of a junction part of an SFQ circuit in a superconducting circuit in a third embodiment.

FIG. 6 is a perspective view showing a configuration of a junction part of an SFQ circuit in a superconducting circuit in the third embodiment.

To the SFQ circuit of the first embodiment, the SFQ circuit of the present embodiment is provided with a ground plane 2 made from La-doped YBaCuO of about 200 nm in thickness on a lower layer portion via an insulating layer 3 made from PrBaCuO of about 300 nm in thickness.

Since inductance in the SFQ circuit can be restrained by providing the ground plane 2, it becomes possible to perform a more rapid operation. Further, it is also possible to block unnecessary flux coming into the junction part of the SFQ circuit from outside by using the Meissner effect obtained from super conductivity.

Fourth Embodiment

Figure 7:
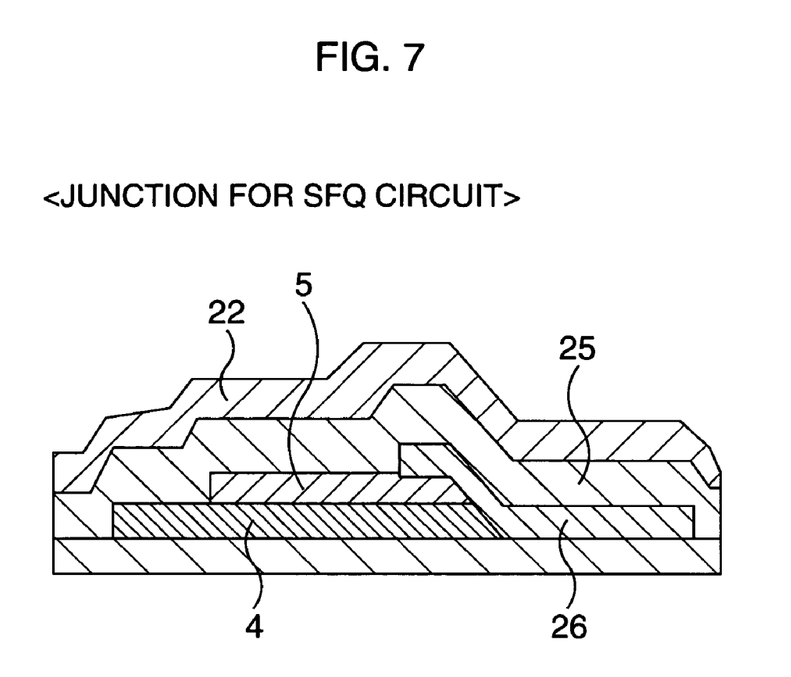
FIG. 7 is a sectional view showing a configuration of a junction part of an SFQ circuit in a superconducting circuit in a fourth embodiment.

FIG. 7 is a sectional view showing a configuration of a junction part of an SFQ circuit in a superconducting circuit in the fourth embodiment.

To the SFQ circuit of the second embodiment, the SFQ circuit of the present embodiment is provided with a ground plane 22 made from YbBaCuO of about 200 nm in thickness on an upper layer portion via an insulating layer 25 made from SrSnO of about 400 nm in thickness.

In the present embodiment, by adopting YbBaCuO which has a deposition temperature lower than the crystallization temperature of La-doped YbBaCuO forming the upper electrode 26 as a material for the ground plane 22, arrangement of the ground plane 22 on the upper electrode 26 can be realized.

Fifth Embodiment

Figure 8:
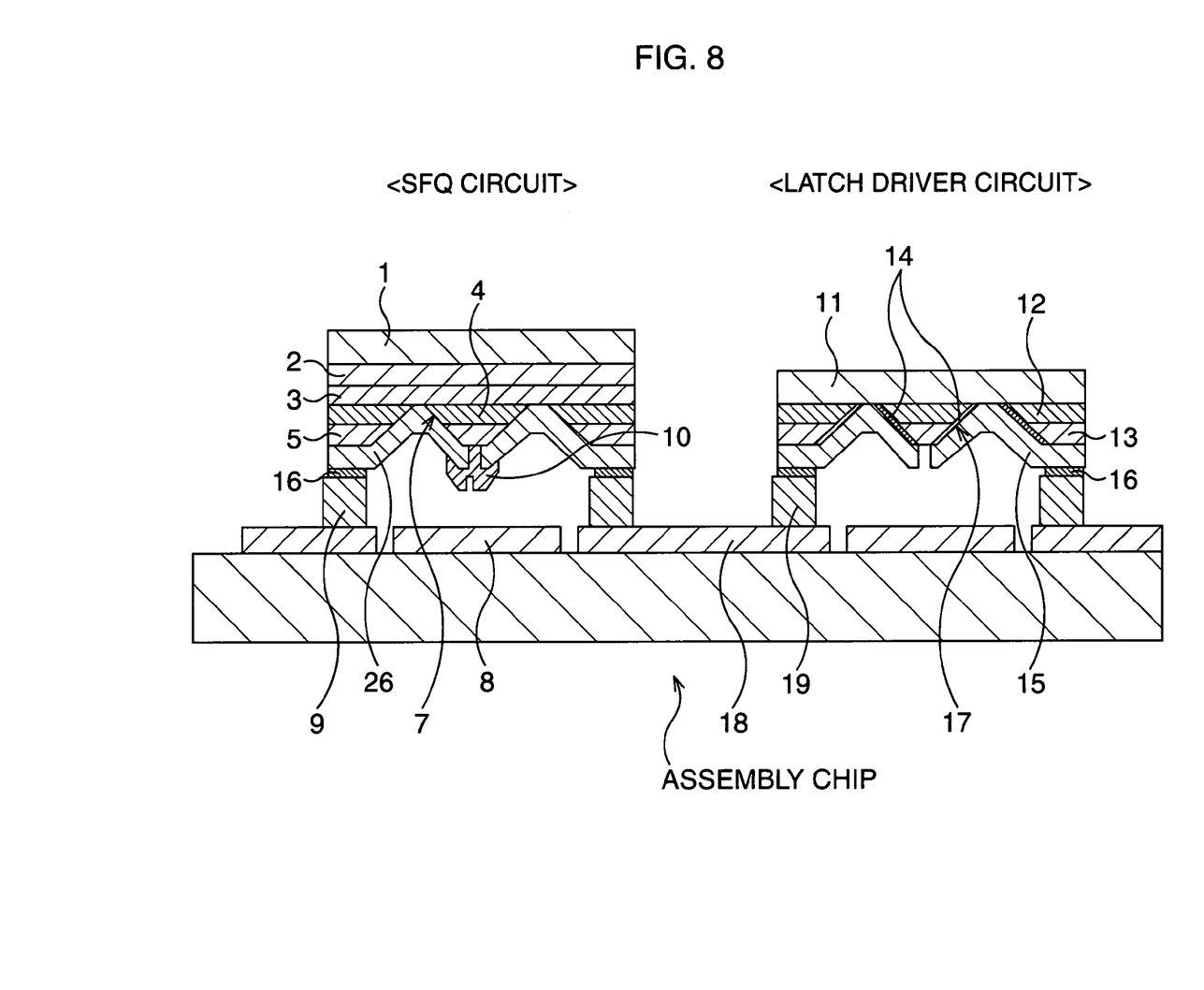
FIG. 8 is a sectional view showing a superconducting circuit in a fifth embodiment.

FIG. 8 is a sectional view showing the superconducting circuit in the fifth embodiment. Here, the same numerals are attached to similar components to the aforementioned components.

The superconducting circuit of the present embodiment is prepared in a manner that an SFQ circuit and a latch driver circuit which have junctions (Josephson junctions 7 and 17) made from materials different from each other are formed on separate substrates (MgO substrates 1 and 11) and put them together on an assembly chip to be a Multi-Chip Module (MCM).

On an upper electrode 26 of the SFQ circuit, a resistor 10 which is made from Au and Ti is arranged to distribute a bias current in the SFQ circuit. The SFQ circuit and the latch driver circuit are connected by a superconducting wiring 18 via an Au layer 16, and a superconducting solder bump 9 or 19. A ground plane 8 is provided on the assembly chip on which the SFQ circuit and the latch driver circuit are placed to block unnecessary flux coming into junction parts from outside by using the Meissner effect obtained from super conductivity.

The superconducting circuit of the present embodiment adopts a multi-chip module structure. The reasons for this are that it is not easy to form junctions made from different materials from each other on the same substrate, and that the optimum conditions of the critical flux density Jc for the SFQ circuit and the latch driver circuit differ from each other and the critical flux density Jc is determined by the combination of junction materials, etc. Considering these reasons, it can be said that an ideal embodiment for the formation of a superconducting circuit is to form an SFQ circuit and a latch driver circuit on respective different substrates and put them together on an assembly chip.

It should be noted that the superconducting circuit shown in FIG. 8 shows the case of connecting the SFQ circuit and the latch driver circuit with a superconducting wiring 18, but it is also possible to configure by using Josephson transmission line (JTL) as this assembly chip.

According to the present invention, the operational range in which a single flux quantum circuit and an interface circuit operate coexistently can be widened, so that respective circuits can be operated in high performance. Thereby, it becomes possible to provide a superconducting circuit to realize a rapid operation at 20 GHZ or more which is useful in fields of communication, computer, and instrumentation such as routers for communication, servers, AD converters, fluxmeters (SQUID), samplers, and so on.

The present embodiments are to be considered in all respects as illustrative and no restrictive, and all changes which come within the meaning and range of equivalency of the claims are therefore intended to be embraced therein. The invention may be embodied in other specific forms without departing from the spirit or essential characteristics thereof.

What is claimed is:

1. A superconducting circuit comprising:
   a single flux quantum circuit using a high temperature superconductor; and
   an interface circuit for said single flux quantum circuit, wherein said single flux quantum circuit is provided with a first Josephson junction, and said interface circuit is provided with a second Josephson junction made from a combination of materials different from those of said first Josephson junction, wherein hysteresis in the current-voltage characteristic of said first Josephson junction is smaller than hysteresis in the current-voltage characteristic of said second Josephson junction,
wherein said first Josephson junction comprises:
a lower electrode made from La-doped YBaCuO;
an upper electrode made from YbBaCuO; and
a damage layer formed between the lower electrode and the upper electrode, serving as a barrier, and
wherein said second Josephson junction comprises:
a lower electrode made from La-doped YBaCuO;
an upper electrode made from La-doped YbBaCuO; and
a layer made from LaSrAlTaO in addition to a damage layer formed between the lower electrode and the upper electrode, serving as a barrier.

2. A superconducting circuit comprising:
a single flux quantum circuit using a high temperature superconductor; and
an interface circuit for said single flux quantum circuit,
wherein said single flux quantum circuit is provided with a first Josephson junction, and said interface circuit is provided with a second Josephson junction made from a combination of materials different from those of said first Josephson junction,
wherein hysteresis in the current-voltage characteristic of said first Josephson junction is smaller than hysteresis in the current-voltage characteristic of said second Josephson junction,
wherein said interface circuit is formed of a latch driver circuit,
wherein said first Josephson junction comprises:
a lower electrode made from La-doped YBaCuO;
an upper electrode made from YbBaCuO; and
a damage layer formed between the lower electrode and the upper electrode, serving as a barrier, and
wherein said second Josephson junction comprises:
a lower electrode made from La-doped YBaCuO;
an upper electrode made from La-doped YbBaCuO; and
a layer made from LaSrAlTaO in addition to a damage layer formed between the lower electrode and the upper electrode, serving as a barrier.

3. A superconducting circuit comprising:
a single flux quantum circuit using a high temperature superconductor; and
an interface circuit for said single flux quantum circuit,
wherein said single flux quantum circuit is provided with a first Josephson junction, and said interface circuit is provided with a second Josephson junction made from a combination of materials different from those of said first Josephson junction,
wherein hysteresis in the current-voltage characteristic of said first Josephson junction is smaller than hysteresis in the current-voltage characteristic of said second Josephson junction,
wherein a junction in which hysteresis in the current-voltage characteristic is 10% or less is used for said first Josephson junction and a junction in which hysteresis in the current-voltage characteristic is 10% or more is used for said second Josephson junction,
wherein said first Josephson junction comprises:
a lower electrode made from La-doped YBaCuO;
an upper electrode made from YbBaCuO; and
a damage layer formed between the lower electrode and the upper electrode, serving as a barrier, and
wherein said second Josephson junction comprises:
a lower electrode made from La-doped YBaCuO;
an upper electrode made from La-doped YbBaCuO; and
a layer made from LaSrAlTaO in addition to a damage layer formed between the lower electrode and the upper electrode, serving as a barrier.

4. The superconducting circuit according to claim 1, wherein said single flux quantum circuit is provided with a ground plane made from La-doped YBaCuO to restrain inductance in the single flux quantum circuit.

5. The superconducting circuit according to claim 2, wherein said single flux quantum circuit is provided with a ground plane made from La-doped YBaCuO to restrain inductance in the single flux quantum circuit.

6. The superconducting circuit according to claim 3, wherein said single flux quantum circuit is provided with a ground plane made from La-doped YBaCuO to restrain inductance in the single flux quantum circuit.

7. The superconducting circuit according to claim 1, wherein said single flux quantum circuit and said interface circuit are structured to be a multi-chip module.

8. The superconducting circuit according to claim 1, wherein said first Josephson junction and said second Josephson junction are each formed by a ramp edge junction.

9. The superconducting circuit according to claim 2, wherein said first Josephson junction and said second Josephson junction are each formed by a ramp edge junction.

10. The superconducting circuit according to claim 3, wherein said first Josephson junction and said second Josephson junction are each formed by a ramp edge junction.

* * * * *

UNITED STATES PATENT AND TRADEMARK OFFICE
CERTIFICATE OF CORRECTION

PATENT NO. : 7,300,909 B2
APPLICATION NO. : 10/809919
DATED : November 27, 2007
INVENTOR(S) : Tsunehiro Hato et al.

It is certified that error appears in the above-identified patent and that said Letters Patent is hereby corrected as shown below:

On Title Page
Item (73) Assignee
"Fujitsu Limited, Kawasaki (JP)" should be --Fujitsu Limited, Kawasaki (JP), and International Superconductivity Technology Center, The Juridical Foundation, Tokyo (JP).--.

Signed and Sealed this

Thirtieth Day of June, 2009

JOHN DOLL
*Acting Director of the United States Patent and Trademark Office*